United States Patent
Allman et al.

[11] Patent Number: 6,010,963
[45] Date of Patent: Jan. 4, 2000

[54] GLOBAL PLANARIZATION USING SOG AND CMP

[75] Inventors: Derryl D. J. Allman; Kenneth P. Fuchs, both of Colorado Springs, Colo.

[73] Assignee: Hyundai Electronics America, San Jose, Calif.

[21] Appl. No.: 08/567,504

[22] Filed: Dec. 5, 1995

Related U.S. Application Data

[63] Continuation of application No. 08/226,190, Apr. 11, 1994, abandoned, which is a continuation of application No. 07/965,309, Oct. 23, 1992, Pat. No. 5,312,512.

[51] Int. Cl.$^7$ .................................................. H01L 21/20
[52] U.S. Cl. ...................... 438/690; 438/388; 438/111; 438/390; 438/691
[58] Field of Search .................... 438/390, 388, 438/111, 691, 692

[56] References Cited

U.S. PATENT DOCUMENTS

| | | | |
|---|---|---|---|
| 3,928,225 | 12/1975 | Schäfer | 252/182 |
| 4,355,454 | 10/1982 | Tasch, Jr. et al. | 29/571 |
| 4,400,411 | 8/1983 | Yuan et al. | 427/86 |
| 4,433,008 | 2/1984 | Schnable et al. | 427/85 |
| 4,455,325 | 6/1984 | Razouk | 427/85 |
| 4,571,366 | 2/1986 | Thomas et al. | 428/446 |
| 4,603,468 | 8/1986 | Lam | 29/571 |
| 4,606,114 | 8/1986 | Kraus | 29/571 |
| 4,628,589 | 12/1986 | Sundaresan | 29/571 |
| 4,661,177 | 4/1987 | Powell | 148/189 |
| 4,775,550 | 10/1988 | Chu et al. | 427/38 |
| 4,826,786 | 5/1989 | Merenda et al. | 437/195 |
| 4,835,113 | 5/1989 | Celler et al. | 437/37 |
| 4,837,179 | 6/1989 | Foster et al. | 437/44 |
| 4,891,331 | 1/1990 | Rapp | 437/164 |
| 4,983,546 | 1/1991 | Hyun et al. | 437/231 |
| 4,986,878 | 1/1991 | Malazgirt et al. | 156/643 |
| 4,996,168 | 2/1991 | Ozaki et al. | 437/164 |
| 5,024,959 | 6/1991 | Pfiester | 437/34 |
| 5,047,357 | 9/1991 | Eklund | 437/31 |
| 5,158,898 | 10/1992 | Hayden et al. | 437/21 |
| 5,169,491 | 12/1992 | Doan | 156/636 |
| 5,222,329 | 6/1993 | Yu | |
| 5,354,712 | 10/1994 | Ho et al. | 437/195 |

FOREIGN PATENT DOCUMENTS

| | | |
|---|---|---|
| 135263 | 11/1978 | Japan . |
| 194525 | 11/1982 | Japan . |
| 87322 | 5/1986 | Japan . |
| 60220 | 3/1987 | Japan . |
| 216322 | 9/1987 | Japan . |
| 8615 | 1/1989 | Japan . |
| 194416 | 8/1989 | Japan . |
| 283828 | 11/1989 | Japan . |

OTHER PUBLICATIONS

S. Wolf, *Silicon processing for the VLSI Era*, vol. 2—Process Technology, Lattice Press, Sunset Beach, CA 1990 pp. 194–199, 277–283.

L.D. Molnar, "SOG Planarization Proves Better Than Photoresist Etch Back," *Semiconductor International*, Aug. 1989, pp. 92–96.

S. WOlf, *Silicon Processing for the VLSI Era*, vol. 2, Lattice Press, Sunset Beach, CA, 1990, pp. 229–239.

Anonymous, "Planarization Procsess Using Spin–on–Glass and Polishing,", *Research Disclosure*, Jun., 1991, RD–32635, p. 404.

*Primary Examiner*—Robert Kunemund
*Attorney, Agent, or Firm*—Townsend and Townsend and Crew LLP

[57] ABSTRACT

A method for planarizing the surface of a semiconductor device which employs spin on glass (SOG) and an etching operation to remove high portions of the SOG prior to a chemical metal polish (CMP) operation. The SOG is baked and cured before etching. Additional layers of SOG and etching operations may be employed as necessary. A thick encapsulating oxide layer is deposited over the SOG layer. For surface irregularities caused by metal lines, an insulating layer may be deposited over the surface before the SOG. Where an additional metal line is to be deposited on the surface, an additional insulating layer is deposited after the CMP operation. In the case of metal lines made of aluminum, provision is also made for preventing Hillock formations on the metal lines.

19 Claims, 4 Drawing Sheets

GLOBAL PLANARIZATION USING SOG AND CMP

This is a continuation of application Ser. No. 08/226,190 filed Apr. 11, 1994 now abandoned, which is a Continuation of application Ser. No. 07/965,309, filed Oct. 23, 1992, now U.S. Pat. No. 5,312,512.

CROSS REFERENCE TO RELATED APPLICATIONS

The present invention is related to the following commonly assigned and co-pending U.S. applications, which have been filed concurrently with the present application:

"Shallow Junction SOG Process", invented by Allman et al.,

"Selective Sidewall Diffusion Process Using Doped SOG", invented by Allman et al., "Method for Forming a Bipolar Emitter Using Doped SOG", invented by Allman et al., "Bipolar Transistor Formation Using Doped SOG", invented by Allman et al.

BACKGROUND OF THE INVENTION

The present invention relates to methods for producing integrated circuit devices and more specifically to a method for planarizing integrated circuit devices using spin on glass (SOG) and chemical mechanical polish (CMP).

Planarization of integrated circuit devices is necessary and desirable to facilitate masking and etching operations. A planarized surface provides a constant depth of focus across the surface of a die for exposing patterns in a photolithography emulsion. While complete planarization is desirable, it is difficult to achieve as the topology of integrated circuit varies across the surface of a die on a wafer.

Planarization of metal interconnect layers improves the yield of devices off of a wafer and the reliability of such devices. Planarization allows the metal interconnect layer to be at a constant thickness across the circuit of a die. Planarization also minimizes the presence of cavities and allows metal interconnect lines to be continuous, where they would otherwise be discontinuous over a non-planar surface containing cavities.

Known methods for planarizing sub-micron device geometries include multiple silicon oxide depositions with insitu etches to fill the spaces between metal lines prior to CMP. This method is also used to fill cavities within the silicon, with an etch process being used to etch away oxide outside the cavities.

However, this method suffers from the disadvantages of high expense, low throughput, process complexity, high defect density, and the presence of material having a high dielectric constant between adjacent metal lines. For surfaces having aspect ratios (defined as the height of a feature divided by the distance to the closest feature) greater than about 1.6, this method fails.

Therefore, it would be desirable to provide a planarization process which does not suffer from the disadvantages of known planarization steps.

SUMMARY OF THE INVENTION

In accordance with the teachings of the present invention, a method for planarizing the surface of a semiconductor die and wafer is provided. The method employs spin on glass (SOG) and an etching operation to remove high portions of the SOG and the deposition of an insulating layer prior to a chemical mechanical polish (CMP) operation. The SOG is baked and cured before etching. Additional layers of SOG and etching operations are employed as necessary. An encapsulating oxide layer is deposited over the SOG layer after the etch process. For surface irregularities caused by metal lines, an insulating layer may be deposited over the surface before the SOG is applied. An additional insulating layer is deposited after the CMP operation if necessary. In the case of metal lines made of aluminum, provision is also made for preventing Hillock formations on the metal lines and providing a polishing stop for the CMP process.

It is accordingly an object of the present invention to provide a global planarization method using doped SOG and CMP.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawings in which:

DETAILED DESCRIPTION OF THE PREFERRED EMBODIMENT

Figure 1:
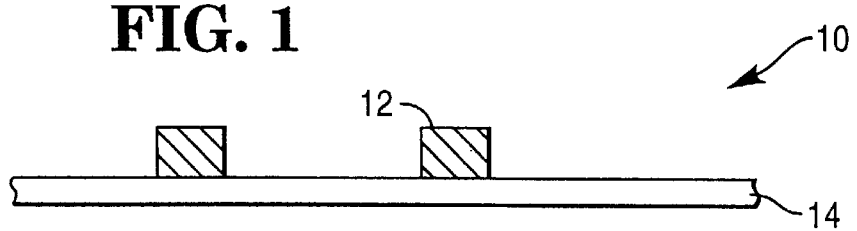
FIG. 1 is a cross-sectional view of a part of an integrated circuit having an uneven surface.

Referring now to FIG. 1, part 10 of an integrated circuit device is shown. Part 10 includes raised features 12, which are shown as metal lines on a silicon wafer 14.

Figure 2:
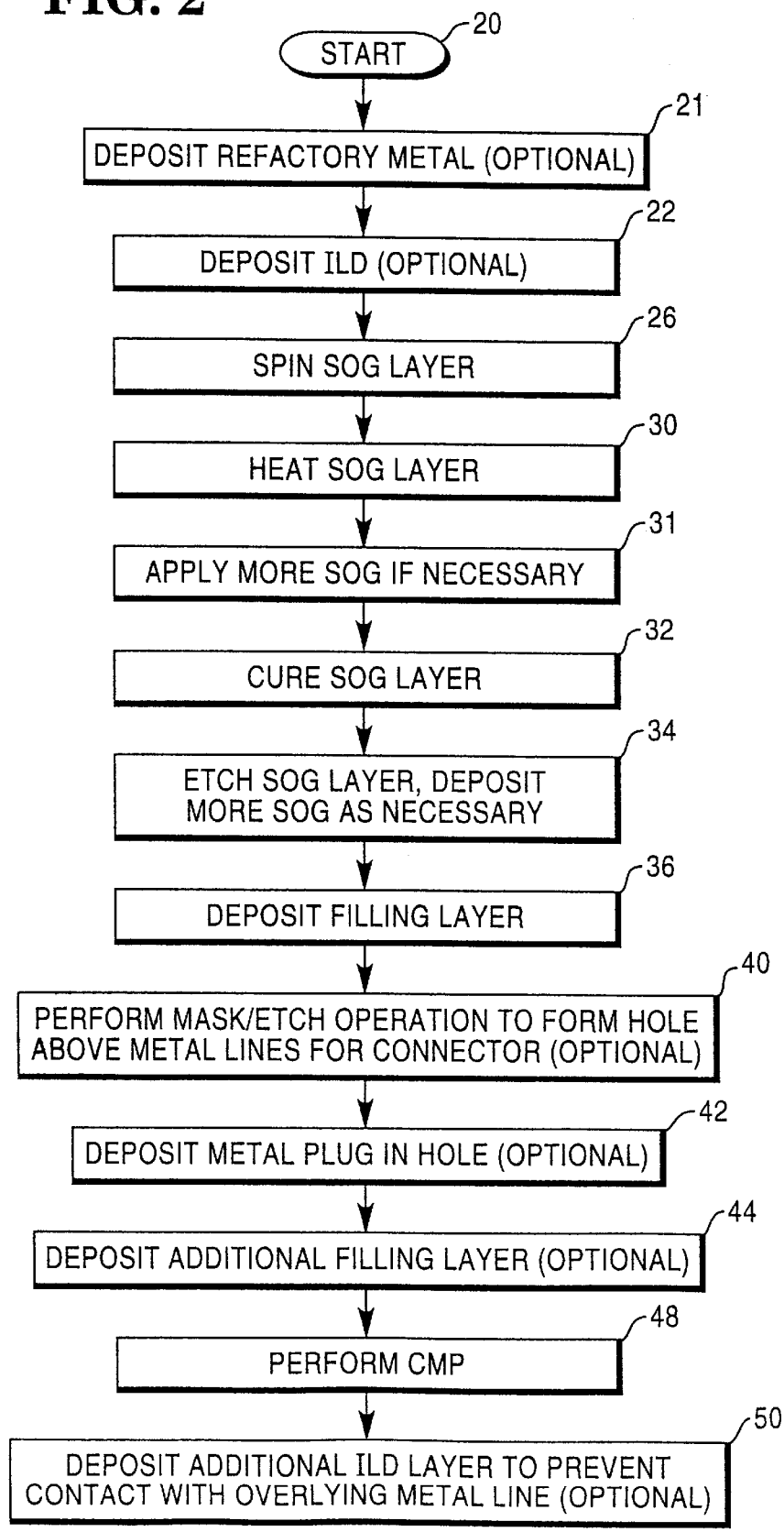
FIG. 2 is a flow diagram illustrating the method of the present invention.

Turning now to FIG. 2, the planarization method of the present invention is shown, beginning with START 20. In block 21, an optional layer of hard refractory metal, such as titanium nitride, titanium tungstide, titanium carbide, tungsten, or titanium may be deposited on aluminum metal lines 12 to act as a polish stop for the CMP process. The hard refractory material would prevent removal or smearing of aluminum, and suppress hillock growth.

Figure 3:
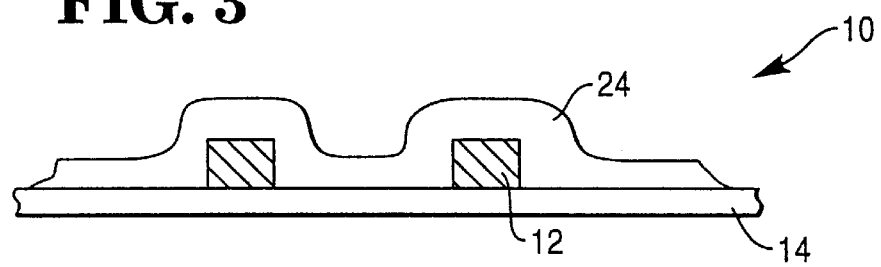
FIG. 3 is a cross-sectional view of a part of the integrated circuit of FIG. 1 at another point in the planarization process.

In block 22, an interlevel dielectric level (ILD) 24 (FIG. 3) is deposited, if necessary. Preferably, ILD 24 is a layer of tetra-ethyl-ortho-silicate (TEOS) for sub-micron technologies. Other organic oxides may be used or a hydride source may be used, such as oxynitride, PECVD siloxane and nitride.

Use of ILD 24 is not preferred unless it is necessary. SOG has a lower dielectric constant than the oxide used to form ILD 24. Using only SOG to fill the gaps between metal lines 12 reduces crosstalk between them, and also reduces the time delay for a signal propagating along metal lines 12.

Figure 4A:
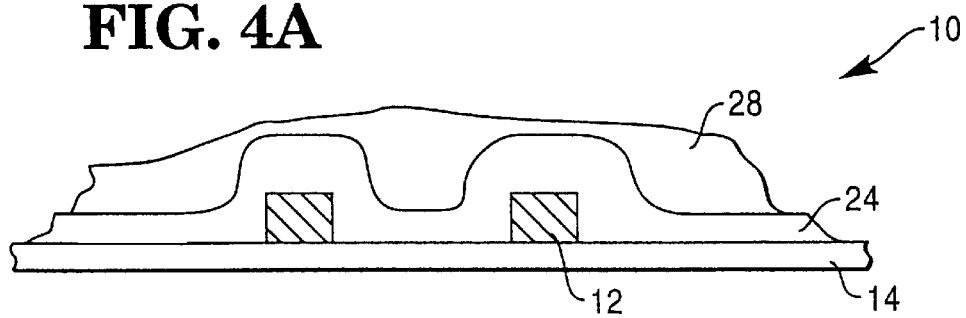
FIG. 4a is a cross-sectional view of a part of the integrated circuit of FIG. 3 at another point in the planarization process.
Figure 4B:
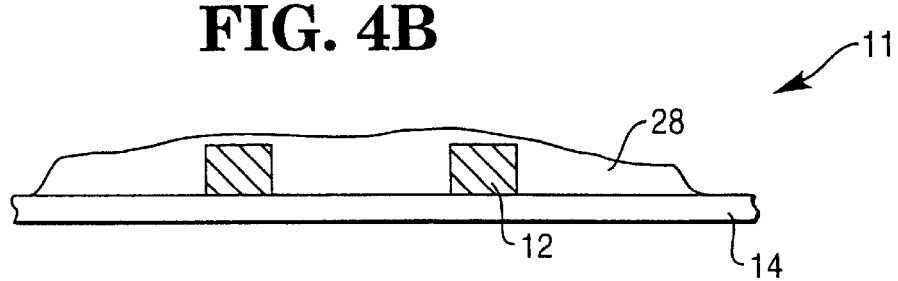
FIG. 4b is a cross-sectional view of a part of the integrated circuit of FIG. 1 at another point in the planarization process.

In block 26, a layer of SOG 28 is spun onto ILD 24 (FIG. 4*a*). If ILD 24 has not been deposited, a layer of SOG 28 is spun over metal lines 12 (FIG. 4*b*) to form device 11.

In block 30, SOG layer 28 is heated to drive out water, using a hot plate process at a temperature between 50 and 300 degrees Celsius for one second to five minutes. Preferably, a hot plate process at 200 degrees Celsius for one minute is employed.

In block 31, additional SOG may be deposited as necessary.

In block 32, SOG layer 28 is cured to remove all trapped low-boiling point trapped organics or solvents and to lower the etch rate of SOG layer 28 to match that of the ILD 24 below it, if deposited.

Figure 5A:
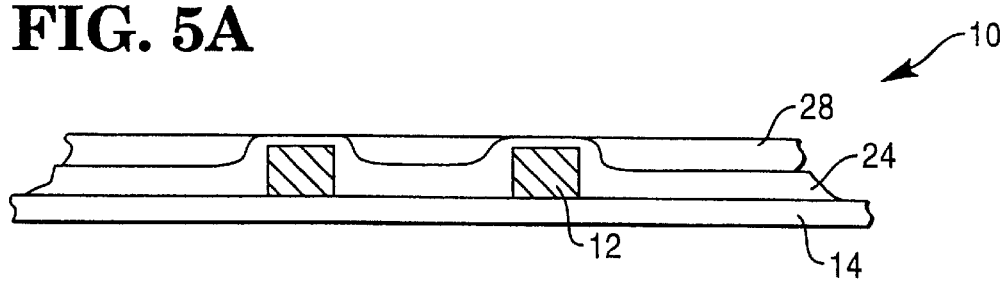
FIG. 5a is a cross-sectional view of a part of the integrated circuit of FIG. 4a at another point in the planarization process.
Figure 5B:
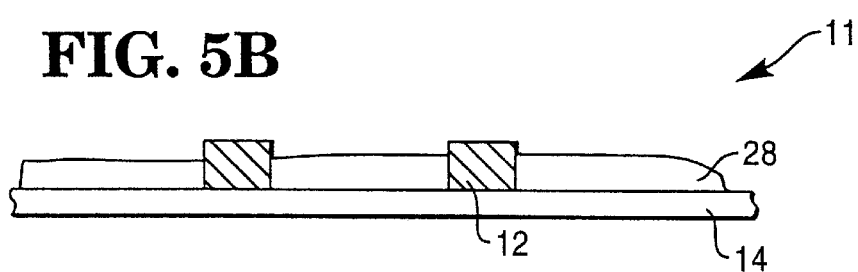
FIG. 5b is a cross-sectional view of a part of the integrated circuit of FIG. 4b at another point in the planarization process.

In block 34, SOG layer 28 is etched to about the top of raised features 12. Preferably, a plasma etch process is employed. For device 10, which includes ILD 24, FIG. 5*a* illustrates that etching preferably extends to a point above metal lines 12. For device 11, which does not include ILD 24, FIG. 5*b* illustrates that etching may extend below the top of metal lines 12.

If more SOG is needed to planarize devices 10 or 11, then more SOG layers having thicknesses between about 1000 to 7000 angstroms may be spun onto SOG layer 28 before performing the etch process of block 34. If further SOG layers are needed, then the baking step must be performed for each additional SOG layer.

Figure 6A:
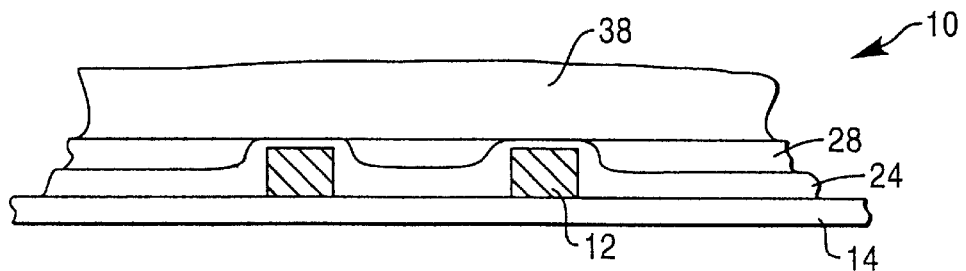
FIG. 6a is a cross-sectional view of a part of the integrated circuit of FIG. 5a at another point in the planarization process.
Figure 6B:
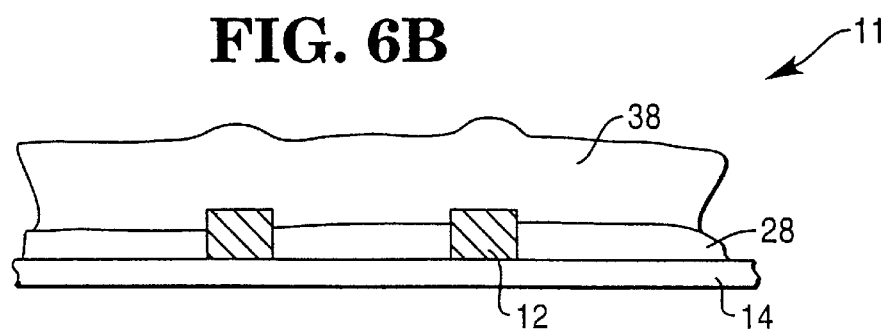
FIG. 6b is a cross-sectional view of a part of the integrated circuit of FIG. 5b at another point in the planarization process.

In block 36, a thick encapsulating oxide layer 38 is deposited over devices 10 and 11 (FIGS. 6*a* and 6*b*). Preferably, plasma enhanced chemical vapor deposition (PECVD) TEOS oxide is employed. Other materials might include PECVD silane oxide, nitride, or oxynitride.

Figure 7A:
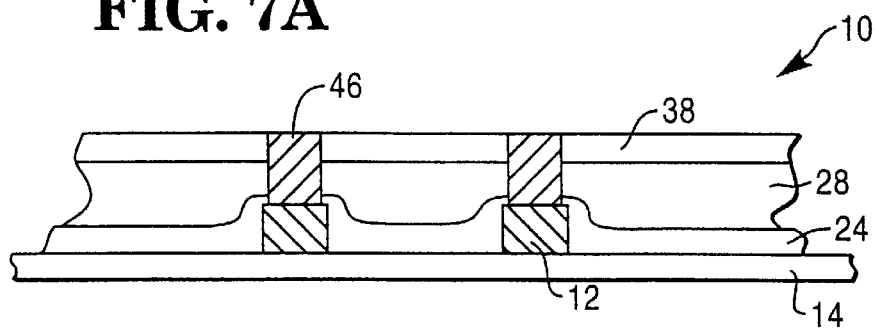
FIG. 7a is a cross-sectional view of a part of the integrated circuit of FIG. 6a at another point in the planarization process.
Figure 7B:
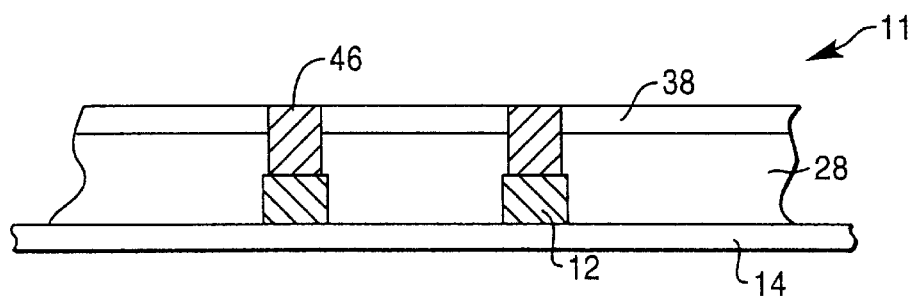
FIG. 7b is a cross-sectional view of a part of the integrated circuit of FIG. 6b at another point in the planarization process.
Figure 8A:
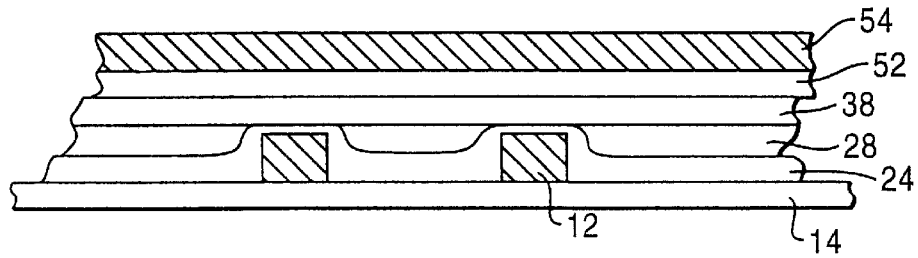
FIG. 8a is a cross-sectional view of a part of the integrated circuit of FIGS. 6a or 7a at another point in the planarization process.
Figure 8B:
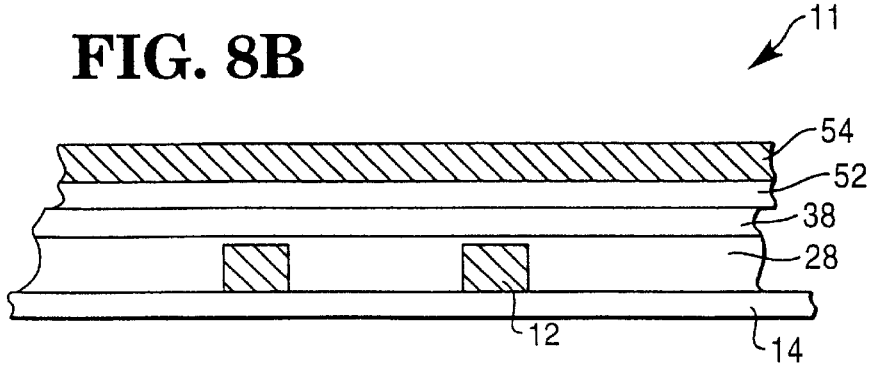
FIG. 8b is a cross-sectional view of a part of the integrated circuit of FIGS. 6b or 7b at another point in the planarization process.

Blocks 40–44 add optional steps to the process if metal lines 12 are aluminum metal lines. In block 40, a mask and etch operation is performed to cut a hole down to metal lines 12. In block 42, a metal plug 46, preferably tungsten, is deposited into the hole to provide contact between metal lines 12 and an overlying metal line 54 (FIGS. 8*a* and 8*b*). Tungsten is used to prevent Hillock formations. In block 44, additional filling may be required as in block 36 (FIGS. 7*a* and 7*b*.).

The tungsten plug operation above does not have to be used to form a contact between metal lines 12 and an overlying conductor. Standard semiconductor processing, using a barrier metal layer followed by an aluminum layer deposited on the top planarized surface and into the hole, may be employed to provide the overlying metal line 54 and the connection to metal lines 12.

In block 48, a CMP process is performed.

In block 50, an additional ILD 52 may be deposited to provide insulation between metal lines 12 and metal line 54 over ILD 52 (FIGS. 8*a* and 8*b*). Block 50 is another optional step, which may be performed following block 44 if contact is desired between metal lines 12 and metal line 54. If contact is not desired, then block 50 follows block 36.

Although the present invention has been described with particular reference to certain preferred embodiments thereof, variations and modifications of the present invention can be effected within the spirit and scope of the following claims.

What is claimed is:

1. A method of planarizing a semiconductor device having an irregular surface with high and low portions, comprising the steps of:

spinning a layer of SOG over the surface;

heating the SOG layer;

repeating the spinning and heating steps, until the surface is substantially flat;

curing the SOG layer; and after curing the SOG layer, etching away portions of the SOG layer.

2. The method as recited in claim 1, wherein the semiconductor device includes a plurality of metal lines made of aluminum which cause the surface irregularities, and wherein the method further comprises the steps of:

prior to said step of spinning a layer of SOG over the surface, depositing a layer of hard refractory metal on said metal lines in order to suppress hillock growth; and depositing an insulating layer over the surface, including the metal lines.

3. The method as recited in claim 1, wherein the step of heating comprises the substep of:

performing a hot plate process to remove the solvent at temperatures between about 50 to 300 degrees Celsius for about one second to five minutes.

4. The method as recited in claim 1, wherein the step of heating comprises the substep of:

performing a plurality of baking operations.

5. A method of planarizing a semiconductor device having an irregular surface with high and low portions, wherein the semiconductor device includes a plurality of first metal lines causing the irregularities in the surface, the method comprising the steps of:

depositing an ILD layer over the surface;

spinning a layer of SOG over the ILD layer;

heating the SOG layer to drive out solvents and low boiling point organics;

repeating the spinning and heating steps, until the surface is substantially flat;

curing the SOG layer;

etching away the higher portions of the SOG layer, depositing a filling layer over the SOG layer;

performing a chemical mechanical polish operation to at least the filling layer;

exposing one or more of the first metal lines by forming one or more holes above the one or more of the first metal lines;

depositing a second metal into said holes above the first metal lines; and depositing at least one third metal line above the filling layer and said one or more holes, so that said at least one third metal line contacts said second metal in said one or more holes allowing electrical conduction between said at least one third metal line and said at least one of the first metal lines via said second metal in said one or more holes.

6. The method as recited in claim 5, wherein said second metal comprises tungsten.

7. The method as recited in claim 5, wherein the plurality of first metal lines comprise aluminum, and wherein the method further comprises the steps of:

prior to said step of depositing an ILD layer over the surface, depositing a layer of hard refractory metal on said first metal lines in order to suppress hillock growth.

8. The method as recited in claim 7, wherein said hard refractory metal comprises a metal selected from the group of metals including titanium nitride, titanium tungstide, titanium carbide, tungsten or titanium.

9. A method of planarizing a semiconductor device having an irregular surface with high and low portions, wherein the semiconductor device includes a plurality of first metal lines causing the irregularities in the surface, the method comprising the steps of:

depositing an ILD layer over the surface;

spinning a layer of SOG over the ILD layer;

heating the SOG layer to drive out solvents and low boiling point organics;

repeating the spinning and heating steps, until the surface is substantially flat;

curing the SOG layer;

etching away the higher portions of the SOG layer;

depositing a filling layer over the SOG layer;

performing a chemical mechanical polish operation to at least the filling layer;

depositing an insulating layer above the filling layer;

depositing at least one second metal line above the insulating layer;

wherein said insulating layer provides insulation between said first metal lines and said second metal lines.

10. The method as recited in claim 9, wherein the plurality of first metal lines comprise aluminum, and wherein the method further comprises the steps of:

prior to said step of depositing an ILD layer over the surface, depositing a layer of hard refractory metal on said first metal lines in order to suppress hillock growth.

11. The method as recited in claim 9, wherein said hard refractory metal comprises a metal selected from the group of metals including titanium nitride, titanium tungstide, titanium carbide, tungsten or titanium.

12. The method as recited in claim 1, wherein the semiconductor device includes a plurality of first metal lines which cause the surface irregularities, and wherein the method further comprises the steps of:

depositing a filling layer over the SOG layer;

performing a chemical mechanical polish operation to at least the filling layer;

exposing at least one of said plurality of first metal lines by forming one or more holes above said at least one of said plurality of first metal lines;

depositing a second metal in said one or more holes; and depositing at least one third metal line above the filling layer and said one or more holes, so that said at least one third metal line contacts said second metal in said one or more holes allowing electrical conduction between said at least one third metal line and said at least one of said plurality of first metal lines via said second metal in said one or more holes.

13. The method as recited in claim 12, wherein said second metal comprises tungsten.

14. The method as recited in claim 12, wherein the plurality of first metal lines comprise aluminum, and wherein the method further comprises the steps of:

prior to said step of spinning a layer of SOG over the surface, depositing a layer of hard refractory metal on said first metal lines in order to suppress hillock growth; and depositing an insulating layer over the surface, including the first metal lines.

15. The method as recited in claim 14, wherein said hard refractory metal comprises a metal selected from the group of metals including titanium nitride, titanium tungstide, titanium carbide, tungsten or titanium.

16. The method as recited in claim 1, wherein the semiconductor device includes a plurality of first metal lines which cause the surface irregularities, and wherein the method further comprises the steps of:

depositing a filling layer over the SOG layer;

performing a chemical mechanical polish operation to at least the filling layer;

depositing an insulating layer above the filling layer;

depositing at least one second metal line above the insulating layer;

wherein said insulating layer provides insulation between said first metal lines and said second metal lines.

17. The method as recited in claim 16, wherein the insulating layer is a second insulating layer and the plurality of first metal lines comprise aluminum, and wherein the method further comprises the steps of:

prior to said step of spinning a layer of SOG over the surface, depositing a layer of hard refractory metal on said first metal lines in order to suppress hillock growth; and depositing an first insulating layer over the surface, including the first metal lines.

18. The method as recited in claim 17, wherein said hard refractory metal comprises a metal selected from the group of metals including titanium nitride, titanium tungstide, titanium carbide, tungsten or titanium.

19. The method as recited in claim 2, wherein said hard refractory metal comprises a metal selected from the group of metals including titanium nitride, titanium tungstide, titanium carbide, tungsten or titanium.

* * * * *